United States Patent [19]

Rathmann et al.

[11] 4,079,409
[45] Mar. 14, 1978

[54] THYRISTOR WITH PRESSURE CONTACTING

[75] Inventors: Karl Rathmann, Belecke; Alois Sonntag, Muhlheim, both of Germany

[73] Assignee: Licentia Patent-Verwaltungs G.m.b.H., Frankfurt am Main, Germany

[21] Appl. No.: 687,485

[22] Filed: May 18, 1976

Related U.S. Application Data

[63] Continuation of Ser. No. 527,856, Nov. 27, 1974, abandoned.

[30] Foreign Application Priority Data

Nov. 27, 1973 Germany .............................. 2358936
Nov. 27, 1973 Germany .......................... 421746[U]

[51] Int. Cl.² ............................................ H01L 23/36
[52] U.S. Cl. ........................................ 357/79; 357/38; 357/65; 357/67; 357/71
[58] Field of Search ....................... 357/38, 65, 67, 71, 357/79

[56] References Cited

U.S. PATENT DOCUMENTS 3,619,738 11/1971 Otsuka .................................... 357/38
3,837,000 9/1974 Platzoeder ............................. 357/65

FOREIGN PATENT DOCUMENTS 935,710 9/1963 United Kingdom ................... 357/38

Primary Examiner—Stanley D. Miller, Jr.
Assistant Examiner—Joseph E. Clawson, Jr.
Attorney, Agent, or Firm—Spencer & Kaye

[57] ABSTRACT

An improved thyristor with pressure contacting in which at least a portion of the control base zone in addition to the cathode zone extends on a single major surface of a wafer-shaped thyristor semiconductor body and the cathode base zone and the control base zone are each contiguous and are provided at least in part at the major surface with completely insulated ohmic electrodes, i.e., cathode and control electrodes. The ohmic cathode and control electrodes are insulated from one another by means of a layer of insulating material which covers those portions of the major surface of the semiconductor body which are not provided with electrodes and the control electrode except for the connecting contact for the control electrode, the planar surface of the layer of insulating material not having to lie at the level of the cathode electrode surface, and the cathode electrode is pressure contacted by means of a contacting wafer which is covered, at least on the surface thereof contacting the cathode electrode, with a highly conductive ductile material and is provided with a recess for the connecting terminal of the control electrode.

8 Claims, 5 Drawing Figures

THYRISTOR WITH PRESSURE CONTACTING

CROSS-REFERENCE TO RELATED APPLICATION

This application is a continuation of copending application Ser. No. 527,856, filed Nov. 27th, 1974, now abandoned.

BACKGROUND OF THE INVENTION

The present invention relates to a thyristor with pressure contacting in which at least a portion of the control base zone in addition to the cathode zone borders on one major surface of a semiconductor wafer-shaped thyristor element and the cathode and control base zones each are contiguous and are provided at least in part with completely insulated ohmic electrodes (cathode and control electrode) at this major surface.

German Auslegeschrift (Published Patent Application) No. 1,209,207 discloses a controllable semiconductor rectifier with the above-described structural features and an npnp semiconductor body in which part of the zone which borders on the cathode zone, here called the emitter zone, and constituting the control base zone extends through this emitter zone to the surface of the semiconductor body, this part of the control base zone being provided with an ohmic electrode at the surface of the semiconductor body. The surface of this penetrating portion of the control base zone forms a contiguous strip pattern on the surface of the emitter or cathode zone which is distributed over the entire surface of the emitter or cathode zone so that the area of the strip pattern is smaller than the area of the emitter or cathode zone at the surface of the semiconductor body and is covered by the ohmic electrode. The strip pattern may be formed as a plurality of interconnected fir-tree patterns which radially outwardly extend from the center of the major surface or as a plurality of strips which intersect at right angles in the shape of a net.

In the known controllable semiconductor rectifier, the surface of the emitter or cathode zone and the ohmic electrode attached thereon are situated lower than the strip pattern of the control base zone including the above-mentioned ohmic electrode with which the strip pattern of the control base zone is provided and the entire surface of the emitter or cathode zone and the ohmic electrode applied thereto are contacted with an electrically conductive material, for example in the form of a wafer or disc. In order to prevent the ohmic electrode of the strip pattern of the control base zone, which lies higher than the ohmic electrode of the emitter or cathode zone from also being contacted by this wafer or disc, it is necessary, however, for this wafer or disc to be provided at its contacting surface with a negative pattern with respect to the strip pattern of the control base zone which negative pattern can be produced only with extreme care and great difficulty.

SUMMARY OF THE INVENTION

It is the object of the present invention to provide perfect and dependable pressure contacting for the ohmic electrode of the cathode zone, i.e., for the cathode of the above-described thyristor, by means of a contacting wafer which is easy to produce and which does not touch the ohmic electrode of the strip pattern of the control base zone.

This is accomplishd according to the present invention in that the control and cathode ohmic electrodes are insulated from one another by means of a layer of insulating material which covers the portions of the major surface of the semiconductor body which are not provided with electrodes as well as the entire control electrode except for the connecting terminal for the control electrode, the planar surface of this insulating layer need not necessarily lie at the level of the cathode electrode surface, and the cathode electrode is pressure contacted by means of a contacting wafer which is coated, at least on the surface thereof which contacts the cathode electrode, with a layer of a highly conductive ductile material and is provided with a recess or opening for the connecting terminal of the control electrode.

Regarding the above-mentioned layer of insulating material, the present invention is further defined in that during the production of the thyristor zone and electrode structure the insulating layer is produced in the following manner by known photomasking techniques in an additional photoprocess.

Either a photolacquer which is used in the additional photoprocess and which is resistant to the process and remains on the thyristor after completion of the process can serve as the insulating layer or the insulating layer can be selectively etched out of a layer of quartz or nitride which has been sputtered onto the entire area of the cathode and the control electrode or finally it may be an insulating lacquer which has been applied by means of a screen printing mask.

According to a further feature of the invention, a hard pressure contacting wafer is used which is covered with a soft-melted silver and which is centered on the semiconductor body by lacquering.

The present invention produces dependable pressure contacting for the cathode even for thyristors having a complicated cathode and control electrode structure. This is possible in that under the contacting pressure the ductile layer of the contacting wafer is plastically deformed and pressed, for example, around the insulating layer of the control electrode which extends beyond the cathode, so that the ductile layer comes into intimate contact with the cathode electrode. Advantageous use of the present invention is seen for the so-called frequency thyristors in which the cathode is provided on the major surface of the semiconductor body in sectors which are divided by finger-shaped radially branching control electrode sections. Thyristors having such a cathode-control electrode structure have the advantage that they can be switched on and off faster via the control electrode than thyristors having the conventional structure.

DESCRIPTION OF THE PREFERRED EMBODIMENTS

Figure 1:
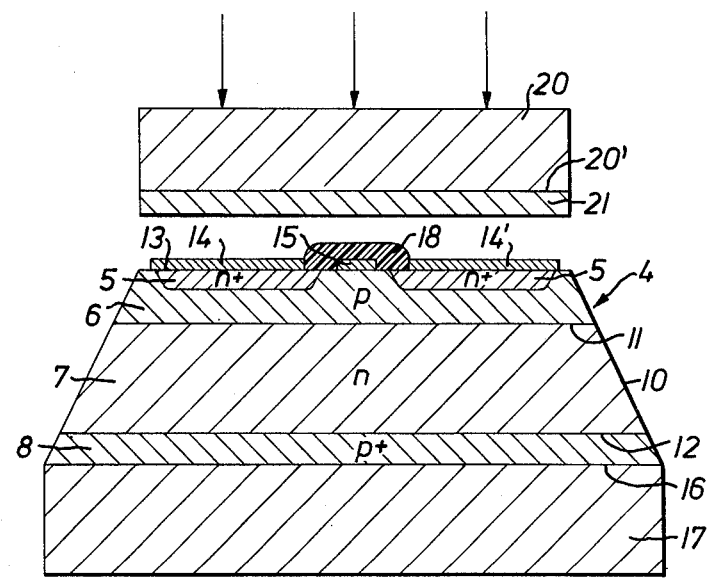
FIG. 1 is a cross-sectional view of a pressure contacted thyristor according to the invention prior to the actual pressure contacting and wherein the insulating layer is higher than the cathode electrode.

Referring now to FIGS. 1-4 there is shown a pressure contacted thyristor with a cathode contact which is disposed above one of the major surfaces which is subdivided by finger-shaped radially branching control electrode sections, the drawing being a cross-sectional view through one finger of the control electrode. This cross-sectional view is not taken along a diameter but along a chord 1—1 of the circular major surfaces of the disc-shaped semiconductor body.

As shown in these figures, the thyristor semiconductor body 4, which for example is made of silicon, has four layer type zones 5-8 of alternatingly opposite conductivity type with an $n^+$ pnp$^+$ zone sequence as illustrated. The $n^+$ zones 5 constitute two sections of the cathode zone of the device and the p zone 6 constitutes the control base zone which extends to the same major surface 13 as the cathode zone 5. The edge surface 10 of thyristor semiconductor body 4 is conically tapered in order to reduce the edge surface field intensity along the lines of intersection of the pn-junction surfaces 11 and 12 with the edge surface 10 whenever a high anode voltage is applied to the blocking thyristor. A larger portion of the illustrated two sections of the $n^+$ cathode zone 5 and an adjacent smaller portion of the p control base zone 6 are each provided, at the smaller major surface 13 of the thyristor device, with a partial ohmic electrode 14, 14' of the cathode. Also a small portion of the p control base zone 6, which lies between the two sections of cathode zone 5 and extends to the smaller major surface 13 is provided with a finger-shaped portion 15 of the ohmic control electrode. The $p^+$ anode zone 8 is bound to a support wafer 17 over the entire larger major surface 16 of semiconductor body 4. The support wafer 17, for example, consists of molybdenum and constitutes the anode electrode for the device.

The ohmic cathode and control electrode as a whole may be produced in a known manner by means of vapor deposition and subsequent alloying on the planar smaller major surface 13 of the silicon thyristor body 4. All of the finger-shaped portions 15 of the control electrodes as well as the portions of the major surface 13 which lie between the cathode electrode sections 14 and 14' are covered with an insulating layer 18, as shown. The insulating layer 18 may, for example, be an insulating lacquer which does not have too good a plastic deformability which layer is applied for example, by means of a screen printing mask. Alternatively the material of the insulating layer 18 may be quartz or a nitride, e.g. silicon nitride, which for example, was sputtered over the entire major surface 13 and then selectively etched to form the desired pattern.

Figure 2:
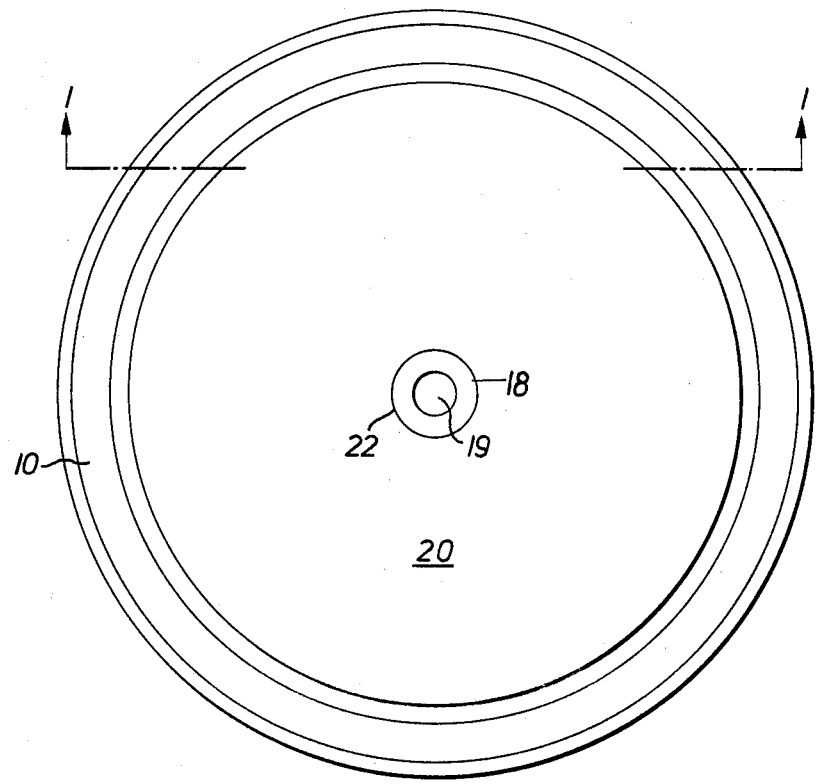
FIG. 2 is a top plan view of the thyristor of FIG. 1.
Figure 3:
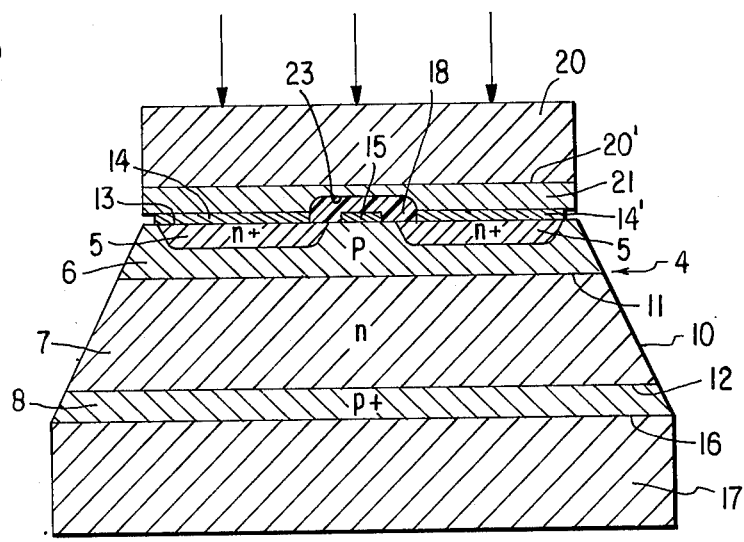
FIG. 3 is a cross-sectional view of the pressure contacted thyristor of FIG. 1 after the actual pressure contacting.
Figure 4:
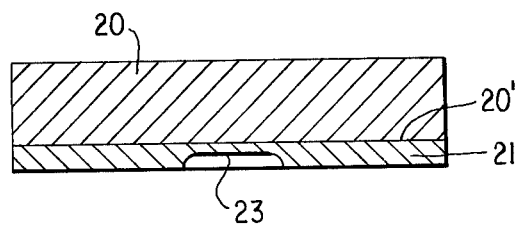
FIG. 4 is a cross-sectional view of the pressure contact of FIG. 3 showing the impression of the insulating layer.

In the embodiment shown in FIGS. 1-4 the insulating layer 18 protrudes beyond the electrode portions or sections 14, 14' for the cathode by, for example, 20μ. The control electrode is provided with a portion 19 for an electrical connection to the control circuit. This connection portion 19 is shown in FIG. 2 and is not covered by the insulating layer 18. The electrode sections 14, 14', as well as the remaining sections of the cathode, which are not shown in the drawing, are pressure contacted by means of a conductive contacting disc 20 formed of a relatively hard metal, which is covered at the contacting surface 20' with a highly conductive, ductile layer 21, for example, of silver which has been annealed at about 600° C. The contacting disc 20 is provided with an opening 22 through which electrical connection to the portion 19 of the control electrode may take place. During pressure contacting, the layer 21 will yield, due to its plastic deformability, with respect to the insulating layer 18. This produces impressions 23 in the layer 21 of a shape which is completely that of the surface of insulating layer 18 on the finger-shaped portions corresponding to part 15 of the control electrode, as is shown in FIG. 4 of the drawing. These impressions 23 together form a negative of the structure pattern of the control electrode as a whole. Via the ductile silver layer 21 the contacting disc 20 is in intimate contact with the cathode electrode and hence the cathode 5 as a whole. The contacting disc 20 is of course centered with respect to the thyristor semiconductor body 4 and is pressure contacted. These elements 4 and 20 are then lacquered together in a known manner with a fixing lacquer.

Figure 5:
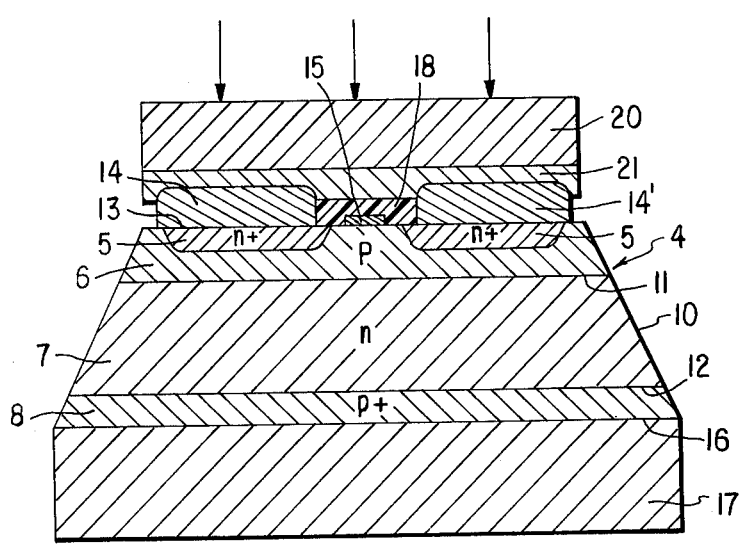
FIG. 5 is a cross-sectional view of a pressure contacted thyristor according to the invention wherein the cathode electrode is higher than the insulating layer.

After application of the insulating layer 18, the cathode electrode sections 14, 14' may be reinforced, for example, by galvanic drawing so that they become higher than the insulating layer 18 as shown in FIG. 5. In this case the contacting surface of the silver layer 21 adapts itself during pressure contacting to the protruding cathode electrode, i.e., a negative pattern or impression of the cathode electrode structure is formed in the silver layer with the same intimate contact of the silver layer with the cathode electrode.

It will be understood that the above description of the present invention is susceptible to various modifications, changes and adaptations, and the same are intended to be comprehended within the meaning and range of equivalents of the appended claims.

What is claimed is:

1. In a thyristor including a wafer shaped semiconductor body with four zones of alternatingly opposite conductivity type between the opposed major surfaces of said semiconductor body and with the cathode zone and a portion of the adjacent control base zone extending to a common one of said major surfaces and being contiguous at said common major surface, a cathode electrode ohmically contacting said cathode zone on said commmon major surface, a control electrode ohmically contacting said portion of said control zone on said common major surface, means for insulating said cathode and gate electrodes from one another, and means for electrically pressure contacting said cathode electrode; the improvement wherein: said means for insulating includes a layer of solid insulating material which covers those portions of said common major surface which are not provided with electrodes and said control electrode except for a contact portion for said control electrode, the planar surface of said insulating layer lying at a level other than that of the cathode electrode surface; and said means for pressure contacting said cathode electrode comprises a metal contacting wafer which is covered, at least on the surface thereof contacting said cathode electrode, with a layer of a highly conductive, ductile material whose maximum thickness is greater than the difference in the levels of the surfaces of said insulating layer and of said cathode electrode, said cathode electrode being provided with an opening over said contact portion for said control electrode.

2. A thyristor as defined in claim 1 wherein: said layer of ductile material is in physical contact with said planar surface of said insulating layer and has an actual negative impression in the surface thereof of the higher of said cathode electrode, and said insulating layer.

3. A thyristor as defined in claim 1 wherein said insulating material is a resistant photolacquer.

4. A thyristor as defined in claim 1 wherein said layer of insulating material is a sputtered layer of quartz or a nitride.

5. A thyristor as defined in claim 1 wherein said insulating material is an insulating lacquer of the type which is applied by means of a screen printing mask.

6. A thyristor as defined in claim 1 wherein said highly conductive ductile material is a soft-heated silver and said contacting wafer is centered on said thyristor wafer and secured thereto by a lacquer.

7. A thyristor as defined in claim 1 wherein said surface of said layer of insulating material is higher than that of said cathode electrode.

8. A thyristor as efined in claim 1 wherein said surface of said layer of insulating material is lower than that of said cathode electrode.

* * * * *